US006858841B2

(12) United States Patent
Truche et al.

(10) Patent No.: US 6,858,841 B2
(45) Date of Patent: Feb. 22, 2005

(54) TARGET SUPPORT AND METHOD FOR ION PRODUCTION ENHANCEMENT

(75) Inventors: Jean-Luc Truche, Los Altos, CA (US); Jian Bai, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 77 days.

(21) Appl. No.: 10/134,806

(22) Filed: Apr. 29, 2002

(65) Prior Publication Data

US 2003/0160167 A1 Aug. 28, 2003

Related U.S. Application Data

(63) Continuation-in-part of application No. 10/080,879, filed on Feb. 22, 2002.

(51) Int. Cl.[7] .......................... H10J 49/04; H10J 49/10; H10J 49/40

(52) U.S. Cl. ....................... 250/288; 250/281; 250/286; 250/492.1

(58) Field of Search ................................ 250/281, 286, 250/288, 492.1

(56) References Cited

U.S. PATENT DOCUMENTS

| | | | | |
|---|---|---|---|---|
| 3,758,777 A | | 9/1973 | Brunnee et al. | |
| 4,023,398 A | | 5/1977 | French et al. | |
| 4,098,589 A | * | 7/1978 | Buswell et al. ................ | 48/94 |
| 4,531,056 A | | 7/1985 | Labowsky et al. | |

FOREIGN PATENT DOCUMENTS

| | | | | |
|---|---|---|---|---|
| DE | DT2227392 | * | 1/1974 ............. | F24H/1/22 |

OTHER PUBLICATIONS

"Matrix–Assisted Laser Desorption/Ionization (MALDI)", http://www–methods.ch.cam.ac.uk/meth/ms/theory/maldi.html.*

De Boer et al., Journal of Applied physics 89 (10) 2001, 5760–5768.*

"Antenna Systems Technology", http://ctd.lerc.nasa.gov/5640/Tutorials.html.*

Agilent Technologies, Agilent 1100 Series, http://www.chem–agilent.com/Scripts/PDS.asp?IPage (Apr. 14, 2001).*

Burle, 5902 Magnum Electron Multiplier, http://www.burle.com/pdf/5902mag.pdf (TP206/JAN01).*

Ryan M. Danell et al., "Heating to Maximize AP–MALDI Performance: Evidence For Desolvation", May 17–31, 2001.

Victor V. Laiko et al., "Atomospheric Pressure MALDI/Ion Trap Mass Spectrometry", Anal. Chem. 2000, pp. 5239–5243.

Victor V. Laiko et al., "Atomspheric Pressure Matrix–Assisted Laser Desorption/Ionization Mass Spectrometry", Anal. Chem. 2000, pp. 652–657.

Victor V. Laiko et al., "Atomospheric Pressure Matrix–Assisted Laser Desorption/Ionization Mass Spectrometry", Anal. Chem. vol. 72, Feb. 15, 2000, pp. 652–657.

Victor V. Laiko et al., "Atmospheric Pressure MALDI/Ion Trap Mass Spectrometry", Anal. Chem. vol. 72, Nov. 1, 2000, pp. 5239–5243.

(List continued on next page.)

*Primary Examiner*—John R. Lee
*Assistant Examiner*—Bernard E. Souw
(74) *Attorney, Agent, or Firm*—Timothy H. Joyce

(57) ABSTRACT

The present invention relates to an apparatus and method for use with a mass spectrometer. The ion production and enhancement system of the present invention is used to enhance analyte ions for ease of detection in a mass spectrometer. The method of the invention comprises producing and enhancing analyte ions with an ion production and enhancement system and detecting the enhanced analyte ions with a detector.

64 Claims, 11 Drawing Sheets-

U.S. PATENT DOCUMENTS

| | | | | | |
|---|---|---|---|---|---|
| 4,766,741 | A | * | 8/1988 | Bartlett et al. | 62/51.2 |
| 4,796,433 | A | * | 1/1989 | Bartlett | 62/47.1 |
| 4,842,701 | A | | 6/1989 | Smith et al. | |
| 4,885,076 | A | | 12/1989 | Smith et al. | |
| 4,968,885 | A | * | 11/1990 | Willoughby | 250/288 |
| 4,999,493 | A | * | 3/1991 | Allen et al. | 250/288 |
| 5,022,379 | A | * | 6/1991 | Wilson, Jr. | 126/116 R |
| 5,027,379 | A | * | 6/1991 | Hunt et al. | 378/4 |
| 5,208,458 | A | | 5/1993 | Busch et al. | |
| 5,272,138 | A | * | 12/1993 | Hakomori et al. | 514/61 |
| 5,272,337 | A | * | 12/1993 | Thompson et al. | 250/288 |
| 5,285,064 | A | | 2/1994 | Willoughby | |
| 5,290,761 | A | * | 3/1994 | Keating et al. | 505/474 |
| 5,498,545 | A | | 3/1996 | Vastal | |
| 5,560,216 | A | * | 10/1996 | Holmes | 62/161 |
| 5,652,427 | A | | 7/1997 | Whitehouse et al. | |
| 5,742,050 | A | * | 4/1998 | Amirav et al. | 250/288 |
| 5,869,832 | A | * | 2/1999 | Wang et al. | 250/288 |
| 5,917,185 | A | | 6/1999 | Yeung et al. | |
| 5,962,851 | A | * | 10/1999 | Whitehouse et al. | 250/288 |
| 5,965,884 | A | | 10/1999 | Laiko et al. | |
| 6,040,575 | A | | 3/2000 | Whitehouse et al. | |
| 6,105,501 | A | * | 8/2000 | Phillips et al. | 101/457 |
| 6,107,626 | A | * | 8/2000 | Wang et al. | 250/288 |
| 6,140,639 | A | | 10/2000 | Gusev et al. | |
| 6,147,345 | A | | 11/2000 | Willoughby | |
| 6,154,608 | A | * | 11/2000 | Rochelle | 392/487 |
| 6,175,112 | B1 | | 1/2001 | Karger et al. | |
| 6,204,500 | B1 | | 3/2001 | Whitehouse et al. | |
| 6,504,150 | B1 | * | 1/2003 | Verentchikov et al. | 250/286 |
| 6,610,976 | B2 | * | 8/2003 | Chait et al. | 250/281 |
| 2002/0053522 | A1 | * | 5/2002 | Cumings et al. | 205/640 |
| 2002/0074517 | A1 | * | 6/2002 | Krutchinsky et al. | 250/492.1 |
| 2002/0121594 | A1 | * | 9/2002 | Wang et al. | 250/281 |
| 2002/0172767 | A1 | * | 11/2002 | Grigorian et al. | 427/255.28 |
| 2003/0003595 | A1 | * | 1/2003 | Amirav | 436/173 |
| 2003/0080290 | A1 | * | 5/2003 | Baranov et al. | 250/288 |

OTHER PUBLICATIONS

Burle brochure TP/JAN01, "5902 Magnum Electron Multiplier", (Burle), Jan. 2001, available at internet website http://www.burle.com/pdf/5902mag.pdf; detector for mass spectrometer.

Danell & Glish, "Heating to Maximize AP–MALDI Performance: Evidence for Desolvation", Proc. 49th ASMS Conf. Mass Spectr. and Allied, Topics, Chicago Ill May 27–31, 2001.

AGILENT Brochure, Agilent 1100 Series LC/MSD Trap VL & SL, "Superior Innovations For Superior Results", 2000–2001, Available at Internet website http://www.chem.agilent.com/Scripts/PDS.asp?Page=76.

Copy of the International Search Report dated Nov. 14, 2003.

* cited by examiner

TARGET SUPPORT AND METHOD FOR ION PRODUCTION ENHANCEMENT

CROSS-REFERENCE TO RELATED APPLICATIONS

This Nonprovisional Application for Patent is a Continuation-in-Part of U.S. Nonprovisional application Ser. No. 10/080,879, which was filed on Feb. 22, 2002. U.S. Nonprovisional Application for Patent Ser. No. 10/080,879 is also hereby incorporated by reference in its entirety.

TECHNICAL FIELD

The invention relates generally to the field of mass spectrometry and more particularly toward a heated target support to provide enhanced analtye ions in an atmospheric pressure matrix assisted laser desorption/ionization (AP-MALDI) mass spectrometer.

BACKGROUND

Most complex biological and chemical targets require the application of complementary multidimensional analysis tools and methods to compensate for target and matrix interferences. Correct analysis and separation is important to obtain reliable quantitative and qualitative information about a target. In this regard, mass spectrometers have been used extensively as detectors for various separation methods. However, until recently most spectral methods provided fragmentation patterns that were too complicated for quick and efficient analysis. The introduction of atmospheric pressure ionization (API) and matrix assisted laser desorption ionization (MALDI) has improved results substantially. For instance, these methods provide significantly reduced fragmentation patterns and high sensitivity for analysis of a wide variety of volatile and non-volatile compounds. The techniques have also had success on a broad based level of compounds including peptides, proteins, carbohydrates, oligosaccharides, natural products, cationic drugs, organoarsenic compounds, cyclic glucans, taxol, taxol derivatives, metalloporphyrins, porphyrins, kerogens, cyclic siloxanes, aromatic polyester dendrimers, oligodeoxynucleotides, polyaromatic hydrocarbons, polymers and lipids.

According to the MALDI method of ionization, the analyte and matrix in solution is applied to a probe or target substrate. As the solvent evaporates, the analyte and matrix co-precipitate out of solution to form a solid solution of the analyte in the matrix on the target substrate. The co-precipitate is then irradiated with a short laser pulse inducing the accumulation of a large amount of energy in the co-precipitate through electronic excitation or molecular vibration of the matrix molecules. The matrix dissipates the energy by desorption, carrying along the analyte into the gaseous phase. During this desorption process, ions are formed by charge transfer between the photo-excited matrix and analyte.

Conventionally, the MALDI technique of ionization is performed using a time-off-flight analyzer, although other mass analyzers such as an ion trap, an ion cyclotron resonance mass spectrometer and quadrupole time-of-flight are also used. These analyzers, however, must operate under high vacuum, which among other things may limit the target throughput, reduce resolution, capture efficiency, and make testing targets more difficult and expensive to perform.

To overcome the above-mentioned disadvantages in MALDI, a technique referred to as AP-MALDI has been developed. This technique employs the MALDI technique of ionization, but at atmospheric pressure. The MALDI and the AP-MALDI ionization techniques have much in common. For instance, both techniques are based on the process of pulsed laser beam desorption/ionization of a solid-state target material resulting in production of gas phase analyte molecular ions.

AP-MALDI can provide detection of a molecular mass up to $10^6$ Da from a target size in the attamole range. In addition, as large groups of proteins, peptides or other compounds are being processed and analyzed by these instruments, levels of sensitivity become increasingly important. Various structural and instrument changes have been made to MALDI mass spectrometers in an effort to improve sensitivity. Additions of parts and components, however, provides for increased instrument cost. In addition, attempts have been made to improve sensitivity by altering the analyte matrix mixed with the target. These additions and changes, however, have provided limited improvements in sensitivity with added cost. More recently, the qualitative and quantitative effects of heat on performance of AP-MALDI has been studied and assessed. In particular, it is believed that the performance of an unheated (room temperature) AP-MALDI source is quite poor due to the large and varying clusters produced in the analyte ions. These large clusters are formed and stabilized by collisions at atmospheric pressure. The results of different AP-MALDI matrixes to different levels of heat have been studied. In particular, studies have focused on heating the transfer capillary near the source. These studies show some limited improvement in overall instrument sensitivity. A drawback of this technique is that heating and thermal conductivity of the system is limited by the materials used in the capillary. Furthermore, sensitivity of the AP MALDI source has been limited by a number of factors including the geometry of the target as well as its position relative to the capillary, the laser beam energy density on the target surface, and the general flow dynamics of the system. Thus, there is a need to improve the sensitivity and results of AP-MALDI mass spectrometers for increased and efficient ion enhancement.

SUMMARY OF THE INVENTION

The present invention relates to an apparatus and method for use with a mass spectrometer. The invention provides an ion production and enhancement system for producing and enhancing analyte ions in a mass spectrometer. The mass spectrometer of the present invention provides an ion production and enhancement system that comprises a matrix based ion source with a heated target support for enhancing analyte ions produced by the ion source, an ion transport system adjacent to or integrated with the ion production and enhancement system for transporting the enhanced analtye ions, and a detector downstream from the transport system for detecting the enhanced analyte ions. The method of the present invention comprises enhancing analyte ions produced from a matrix based ion source by heating a target support and a region adjacent to the target support and detecting the enhanced analyte ions with a detector.

BRIEF DESCRIPTION OF THE FIGURES

The invention is described in detail below with reference to the following figures.

DETAILED DESCRIPTION OF THE INVENTION

Figure 1A:
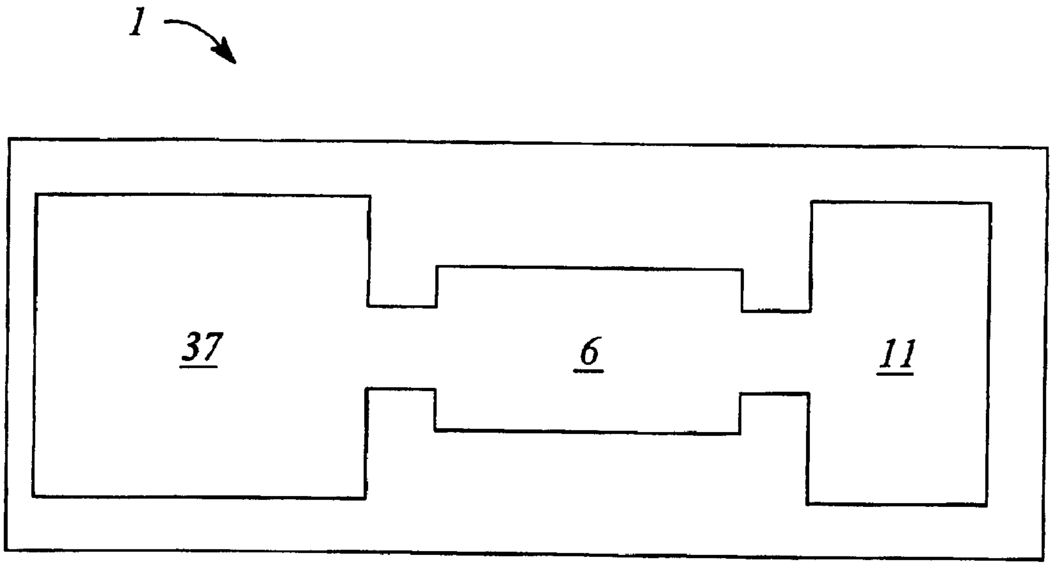
FIG. 1A shows general block diagram of a mass spectrometer.

Before describing the invention in detail, it must be noted that, as used in this specification and the appended claims, the singular forms "a," "an," and "the" include plural referents unless the context clearly dictates otherwise. Thus, for example, reference to "a conduit" includes more than one "conduit". Reference to a "matrix" includes more than one "matrix" or a mixture of "matrixes". In describing and claiming the present invention, the following terminology will be used in accordance with the definitions set out below.

The term "adjacent" means, near, next to or adjoining. Something adjacent may also be in contact with another component, surround the other component, be spaced from the other component or contain a portion of the other component. For instance, a capillary that is adjacent to a conduit may be spaced next to the conduit, may contact the conduit, may surround or be surrounded by the conduit, may contain the conduit or be contained by the conduit, may adjoin the conduit or may be near the conduit.

The term "conduit" or "heated conduit" refers to any sleeve, transport device, dispenser, nozzle, hose, pipe, plate, pipette, port, connector, tube, coupling, container, housing, structure or apparatus that may be used to direct a heated gas or gas flow toward a defined region in space such as an ionization region. In particular, the "conduit" may be designed to enclose a capillary or portion of a capillary that receives analyte ions from an ion source. The term should be interpreted broadly, however, to also include any device, or apparatus that may be oriented toward the ionization region and which can provide a heated gas flow toward or into ions in the gas phase and/or in the ionization region. For instance, the term could also include a concave or convex plate with an aperture that directs a gas flow toward the ionization region.

The term "enhance" refers to any external physical stimulus such as heat, energy, light, or temperature change, etc. that makes a substance more easily characterized or identified. For example, a heated gas may be applied to "enhance" ions. The ions increase their kinetic energy, potentials or motions and are declustered or vaporized. Ions in this state are more easily detected by a mass analyzer. It should be noted that when the ions are "enhanced", the number of ions detected is enhanced since a higher number of analyte ions are sampled through a collecting capillary and carried to a mass analyzer or detector.

The term "ion source" or "source" refers to any source that produces analyte ions. Ion sources may include other sources besides AP-MALDI ion sources such as electron impact (herein after referred to as EI), chemical ionization (CI) and other ion sources known in the art. The term "ion source" refers to the laser, target substrate, and target to be ionized on the target substrate. The target substrate in AP-MALDI may include a grid for target deposition. Spacing between targets on such grids is around 1–10 mm. Approximately 0.5 to 2 microliters is deposited on each site on the grid.

The term "ionization region" refers to the area between the ion source and the collecting capillary. In particular, the term refers to the analyte ions produced by the ion source that reside in that region and which have not yet been channeled into the collecting capillary. This term should be interpreted broadly to include ions in, on, about or around the target support as well as ions in the heated gas phase above and around the target support and collecting capillary. The ionization region in AP MALDI is around 1–5 mm in distance from the ion source (target substrate) to a collecting capillary (or a volume of 1–5 mm ). The distance from the target substrate to the conduit is important to allow ample gas to flow from the conduit toward the target and target substrate. For instance, if the conduit is too close to the target or target substrate, then arcing takes place when voltage is applied. If the distance is too far, then there is no efficient ion collection.

The term "ion enhancement system" refers to any device, apparatus or components used to enhance analyte ions. The term does not include directly heating a capillary to provide conductive heat to an ion stream. For example, an "ion enhancement system" comprises a conduit and a gas source. An ion enhancement system may also include other devices well known in the art such as a laser, infrared red device, ultraviolet source or other similar type devices that may apply heat or energy to ions released into the ionization region or in the gas phase.

The term "ion production and enhancement system" refers to any device, apparatus or components used to produce and enhance analyte ions. For instance, a heated target support can be used to both provide for ion production and enhancement. The term does not include directly heating a capillary to provide conductive heat to an ion stream. The ion production and enhancement system may further comprise an ion source and an ion enhancement system. The ion source and the ion enhancement system can be separate devices or integrated, part of or comprise the same apparatus.

The term "ion transport system" refers to any device, apparatus, machine, component, capillary, that shall aid in the transport, movement, or distribution of analyte ions from one position to another. The term is broad based to include ion optics, skimmers, capillaries, conducting elements and conduits.

The terms "matrix based", or "matrix based ion source" refers to an ion source or mass spectrometer that does not require the use of a drying gas, curtain gas, or desolvation step. For instance, some systems require the use of such gases to remove solvent or cosolvent that is mixed with the analyte. These systems often use volatile liquids to help form smaller droplets. The above term applies to both nonvolatile liquids and solid materials in which the sample is dissolved. The term includes the use of a cosolvent. Cosolvents may be volatile or nonvolatile, but must not render the final matrix material capable of evaporating in vacuum. Such materials would include, and not be limited to m-nitrobenzyl alcohol (NBA), glycerol, triethanolamine (TEA), 2,4-dipentylphenol,1,5-dithiothrietol/dierythritol (magic bullet), 2-nitrophenyl octyl ether (NPOE), thioglycerol, nicotinic acid, cinnamic acid, 2,5-dihydroxy benzoic acid (DHB), 3,5-dimethoxy-4-hydroxycinnamic acid (sinpinic acid), α-cyano-4-hydroxycinnamic acid (CCA), 3-methoxy-4-hydroxycinnamic acid (ferulic acid),), monothioglycerol, carbowax, 2-(4-hydroxyphenylazo) benzoic acid (HABA), 3,4-dihydroxycinnamic acid (caffeic acid), 2-amino-4-methyl-5-nitropyridine with their cosolvents and derivatives. In particular the term refers to MALDI, AP-MALDI, fast atom/ion bombardment (FAB) and other similar systems that do not require a volatile solvent and may be operated above, at, and below atmospheric pressure.

The term "gas flow", "gas", or "directed gas" refers to any gas that is directed in a defined direction in a mass spectrometer. The term should be construed broadly to include monatomic, diatomic, triatomic and polyatomic molecules that can be passed or blown through a conduit. The term should also be construed broadly to include mixtures, impure mixtures, or contaminants. The term includes both inert and non-inert matter. Common gases used with the present invention could include and not be limited to ammonia, carbon dioxide, helium, fluorine, argon, xenon, nitrogen, air etc.

The term "gas source" refers to any apparatus, machine, conduit, or device that produces a desired gas or gas flow. Gas sources often produce regulated gas flow, but this is not required.

The term "capillary" or "collecting capillary" shall be synonymous and will conform with the common definition(s) in the art. The term should be construed broadly to include any device, apparatus, orifice, tube, hose or conduit that may receive ions.

The term "detector" refers to any device, apparatus, machine, component, or system that can detect an ion. Detectors may or may not include hardware and software. In a mass spectrometer the common detector includes and/or is coupled to a mass analyzer.

The invention is described with reference to the figures. The figures are not to scale, and in particular, certain dimensions may be exaggerated for clarity of presentation.

FIG. 1A shows a general block diagram of a mass spectrometer. The block diagram is not to scale and is drawn in a general format because the present invention may be used with a variety of different types of mass spectrometers. The mass spectrometer 1 of the present invention comprises an ion production and enhancement system 37, an ion transport system 6 and a detector 11. The ion production and enhancement system 37 may comprise an ion source 3 and ion enhancement system 2 as one integrated part (See FIG. 1A) or as separate components (See FIG. 1B). The ion source 3 may be located in a number of positions or locations. In addition, a variety of ion sources may be used with the present invention. For instance, EI, CI or other ion sources well known in the art may be used with the invention. In one embodiment of the present invention (FIG. 1B and 2A), the ion enhancement system 2 may comprise a conduit 9 and a gas source 7. The ion enhancement system 2 should not be interpreted to be limited to just these two configurations or embodiments. The ion transport system 6 is adjacent to the ion enhancement system 2 and may also comprise a collecting capillary 5 or any ion optics, conduits or devices that may transport analyte ions and that are well known in the art.

Figure 1B:
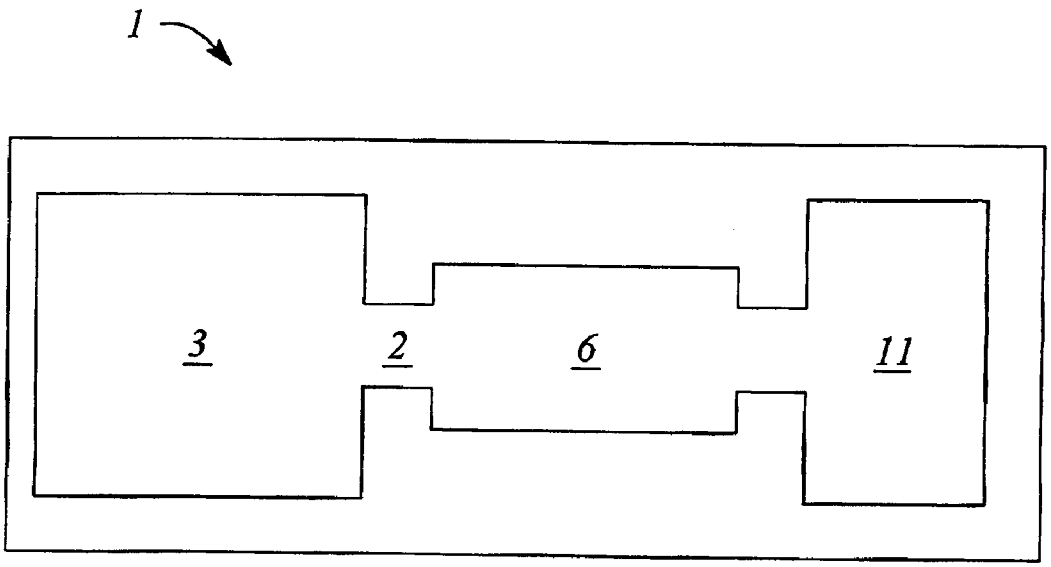
FIG. 1B shows a second general block diagram of a mass spectrometer.

FIG. 1B shows a second general block diagram of a mass spectrometer. The block diagram is not to scale and is drawn in a general format, because the present invention may be used with a variety of different types of mass spectrometers. The mass spectrometer 1 of the present invention comprises the ion source 3, the ion enhancement system 2, the ion transport system 6 and the detector 11. The ion enhancement system 2 may be interposed between the ion source 3 and the ion detector 11 or may comprise part of the ion source 3 and/or part of the ion transport system 6.

As described above, the ion source 3 may be located in a number of positions or locations. In addition, a variety of ion sources may be used with the present invention. For instance, EI, CI or other ion sources well known in the art may be used with the invention. The ion enhancement system 2 may comprise a conduit 9 and a gas source 7. Further details of the ion enhancement system 2 are provided in FIGS. 2–3. The ion enhancement system 2 should not be interpreted to be limited to just these two configurations or embodiments. The ion transport system 6 is adjacent to the ion enhancement system 2 and may comprise a collecting capillary 5 or any ion optics, conduits or devices that may transport analyte ions and that are well known in the art.

Figure 2A:
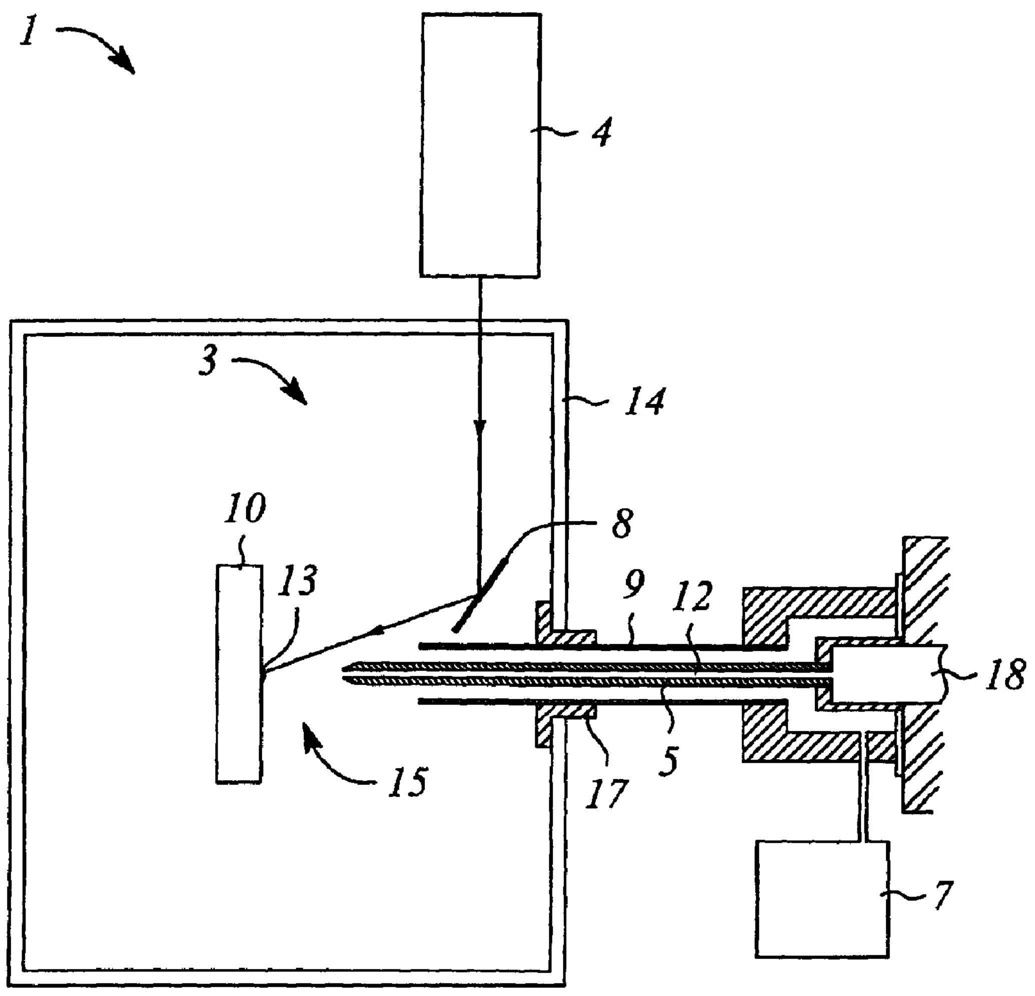
FIG. 2A shows a first embodiment of the present invention.

FIG. 2A shows a cross-sectional view of a first embodiment of the invention. The figure shows the present invention applied to an AP-MALDI mass spectrometer system. For simplicity, the figure shows the invention with a source housing 14. The use of the source housing 14 to enclose the ion source and system is optional. Certain parts, components and systems may or may not be under vacuum. These techniques and structures are well known in the art.

The ion source 3 comprises a laser 4, a deflector 8 and a target support 10. A target 13 is applied to the target support 10 in a matrix material well known in the art. The laser 4 provides a laser beam that is deflected by the deflector 8 toward the target 13. The target 13 is then ionized and the analyte ions are released as an ion plume into an ionization region 15.

The ionization region 15 is located between the ion source 3 and the collecting capillary 5. The ionization region 15 comprises the space and area located in the area between the ion source 3 and the collecting capillary 5. This region contains the ions produced by ionizing the sample that are vaporized into a gas phase. This region can be adjusted in size and shape depending upon how the ion source 3 is arranged relative to the collecting capillary 5. Most importantly, located in this region are the analyte ions produced by ionization of the target 13.

The collecting capillary 5 is located downstream from the ion source 3 and may comprise a variety of material and designs that are well known in the art. The collecting capillary 5 is designed to receive and collect analyte ions produced from the ion source 3 that are discharged as an ion plume into the ionization region 15. The collecting capillary 5 has an aperture and/or elongated bore 12 that receives the analyte ions and transports them to another capillary or location. In FIG. 2 the collecting capillary 5 is connected to a main capillary 18 that is under vacuum and further downstream. The collecting capillary 5 may be supported in place by an optional insulator 17. Other structures and devices well known in the art may be used to support the collecting capillary 5.

Important to the invention is the conduit 9. The conduit 9 provides a flow of heated gas toward the ions in the ionization region 15. The heated gas interacts with the analyte ions in the ionization region 15 to enhance the analyte ions and allow them to be more easily detected by the detector 11 (not shown in FIG. 2). These ions include the ions that exist in the heated gas phase. The detector 11 is located further downstream in the mass spectrometer (see FIG. 1). The conduit 9 may comprise a variety of materials and devices well known in the art. For instance, the conduit 9 may comprise a sleeve, transport device, dispenser, nozzle, hose, pipe, pipette, port, connector, tube, coupling, container, housing, structure or apparatus that is used to direct a heated gas or gas flow toward a defined region in space or location such as the ionization region 15. It is important to the invention that conduit 9 be positioned sufficiently close to the target 13 and the target support 10 so that a sufficient amount of heated gas can be applied to the ions in the ionization region 15.

The gas source 7 provides the heated gas to the conduit 9. The gas source 7 may comprise any number of devices to provide heated gas. Gas sources are well known in the art and are described elsewhere. The gas source 7 may be a separate component as shown in FIGS. 2–3 or may be integrated with a coupling 23 (shown in FIG. 4) that operatively joins the collecting capillary 5, the conduit 9 and the main capillary 18. The gas source 7, may provide a number of gases to the conduit 9. For instance, gases such as nitrogen, argon, xenon, carbon dioxide, air, helium etc. may be used with the present invention. The gas need not be inert and should be capable of carrying a sufficient quantity of energy or heat. Other gases well known in the art that contain these characteristic properties may also be used with the present invention.

Figure 2B:
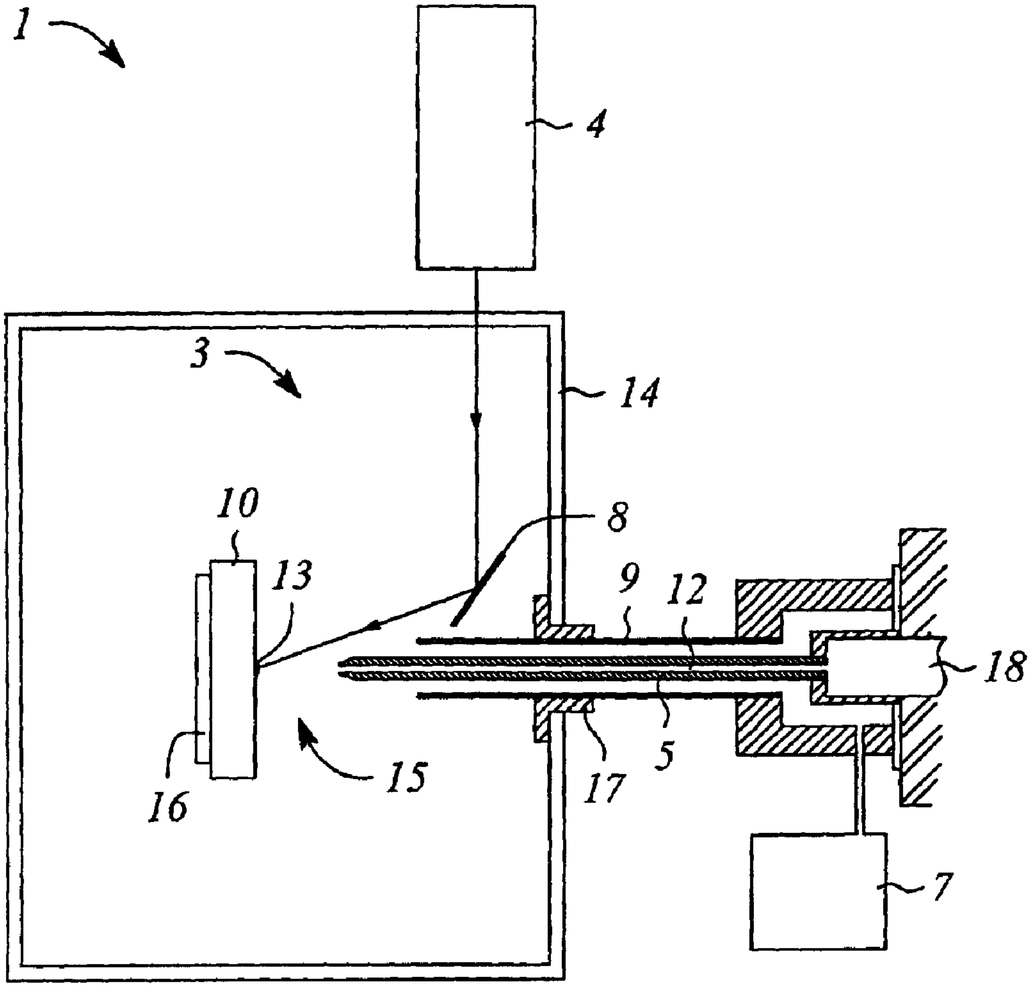
FIG. 2B shows another embodiment of the invention shown in FIG. 2A.

FIG. 2B shows another embodiment of the invention shown in FIG. 2A. This embodiment includes the use of an optional heating device 16 that supplies heat to the target support 10. The heating device 16 may be used with or without the conduit 9 and associated parts. In other words, the heating device 16 may be used with the capillary 5 and may serve the dual purpose of ion production and enhancement. Ion enhancement is obtained by applying heat to the ionization region 15. The heating device 16 supplies heat to the target support 10. The heat then enhances the ions in the ionization region 15 produced from ionization of the target 13. It is within the scope of the invention that the heating device 16 also provide for the ionization of the target 13. However, it is standard in the industry to use the laser 4 (as shown in FIGS. 2A–2B, 3A–3B) to ionize such targets. Any heating device known in the art may be used to supply heat to the target support 10. Such heating devices may include and are not limited to conductive and radiative heating devices, an embedded heater, a heated fluid, a hot plate and a heated holder.

Figure 3A:
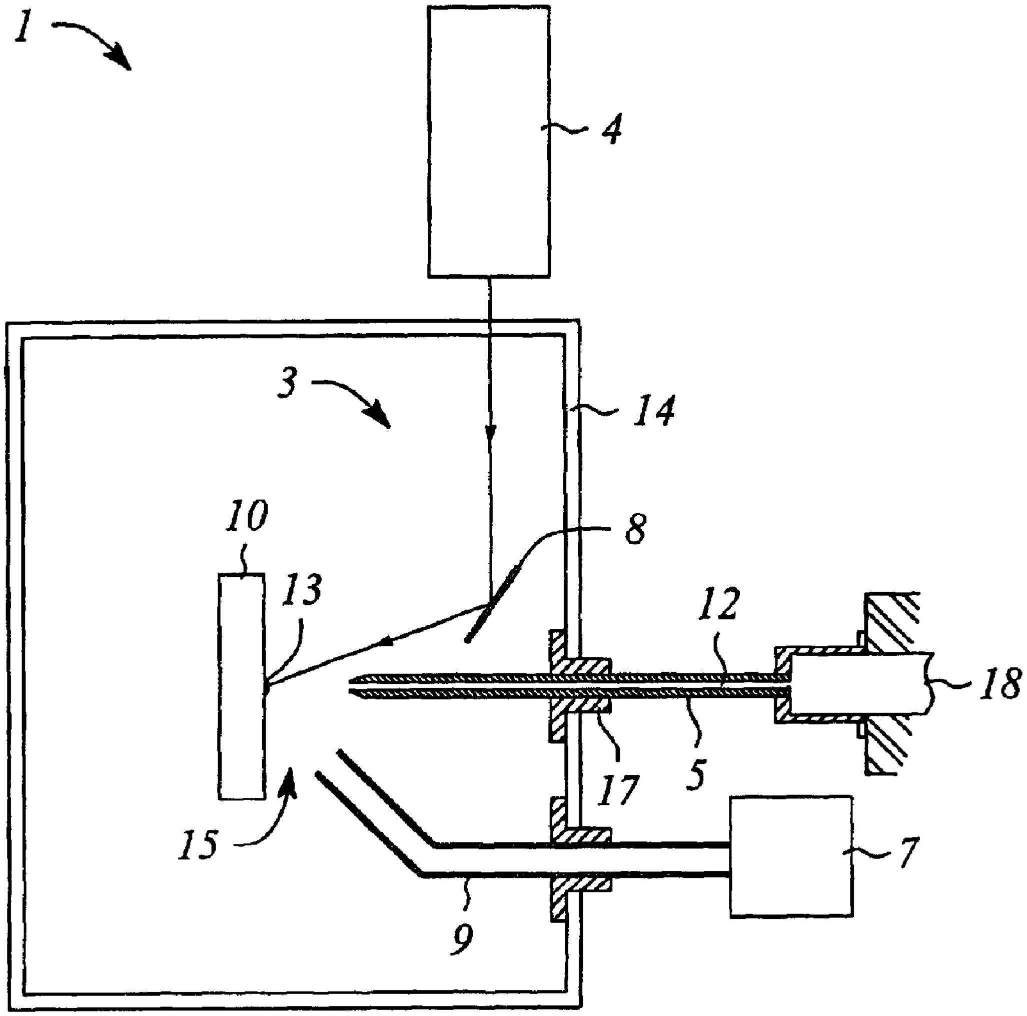
FIG. 3A shows a second embodiment of the present invention.

FIG. 3A shows a cross sectional view of a second embodiment of the present invention. The conduit 9 may be oriented in any number of positions to direct gas toward the ionization region 15. FIG. 3 in particular shows the conduit 9 in detached mode from the collecting capillary 5. It is important to the invention that the conduit 9 be capable of directing a sufficient flow of heated gas to provide enhancement to the analyte ions located in the ionization region 15. The conduit 9 can be positioned from around 1–5 mm in distance from the target 13 or the target support 10. The heated gas applied to the target 13 and the target support 10 should be in the temperature range of about 60–150 degrees Celsius. The gas flow rate should be approximately 2–15 L/minute.

Figure 3B:
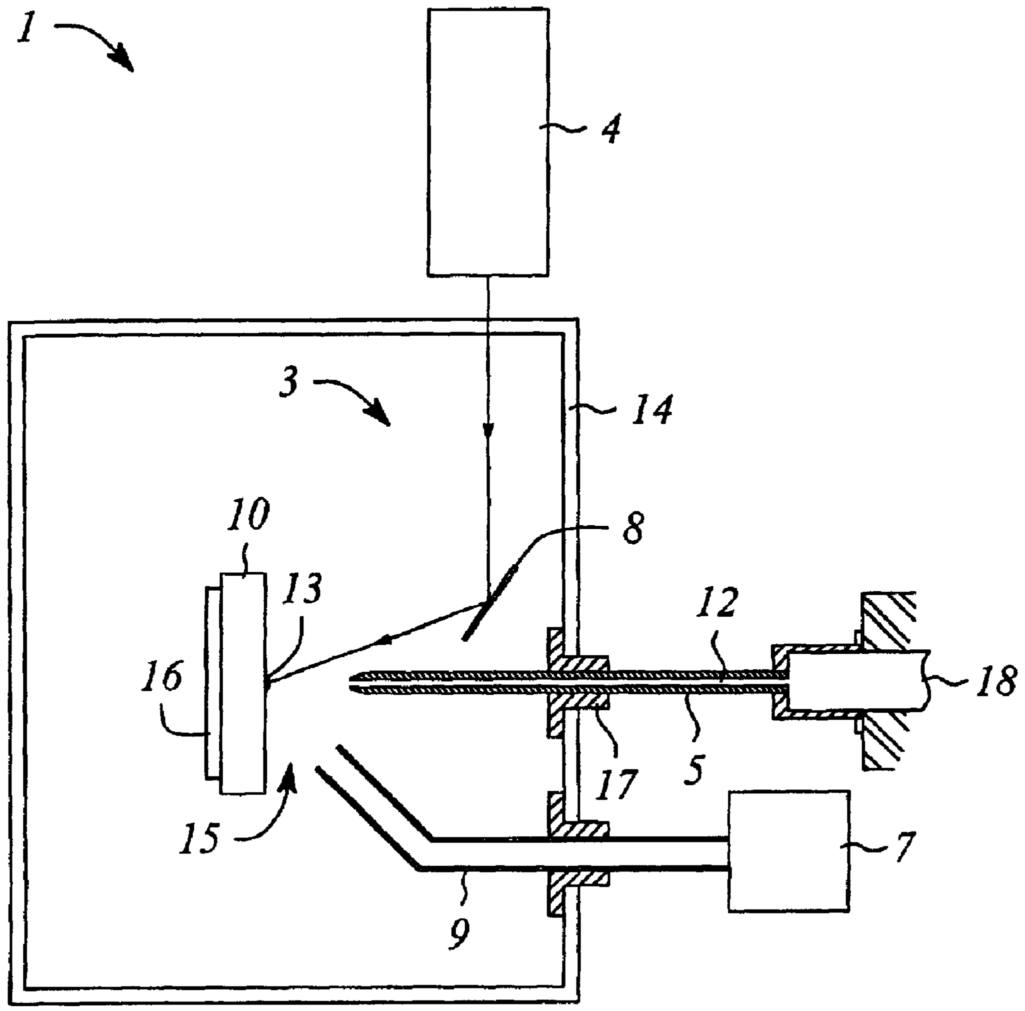
FIG. 3B shows another embodiment of the invention shown in FIG. 3A.

FIG. 3B shows another embodiment of the invention shown in FIG. 3A. This embodiment includes the use of the optional heating device 16 that supplies heat to the target support 10. The heating device 16 may be used with or without the conduit 9 and associated parts. In other words, the heating device 16 may be used with the capillary 5 and may serve the dual purpose of ion production and enhancement. Ion enhancement is obtained by applying heat to the ionization region 15. The heating device 16 supplies heat to the target support 10. The heat then enhances the ions in the ionization region 15 produced from ionization of the target 13. It is within the scope of the invention that the heating device 16 also provide for the ionization of the target 13. However, it is standard in the industry to use the laser 4 (as shown in FIGS. 2A–2B, 3A–3B) to ionize such targets. Any heating device known in the art may be used to supply heat to the target support 10.

Figure 4:
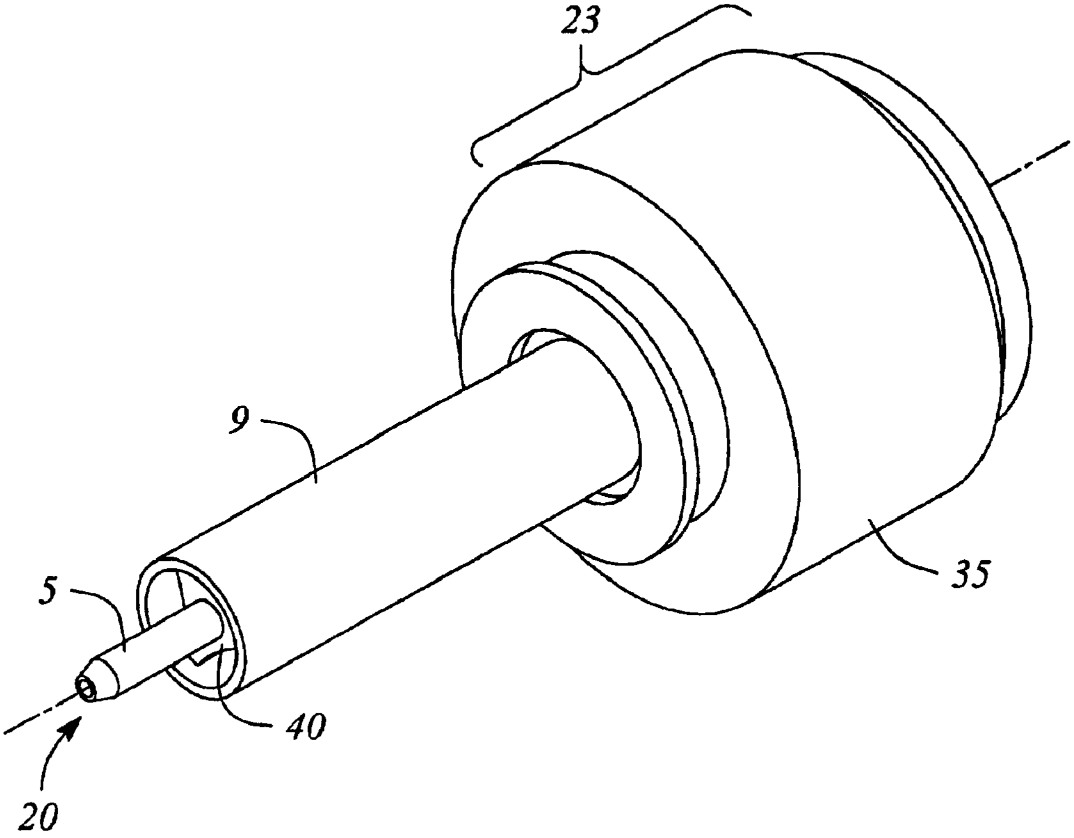
FIG. 4 shows a perspective view of the first embodiment of the invention.
Figure 5:
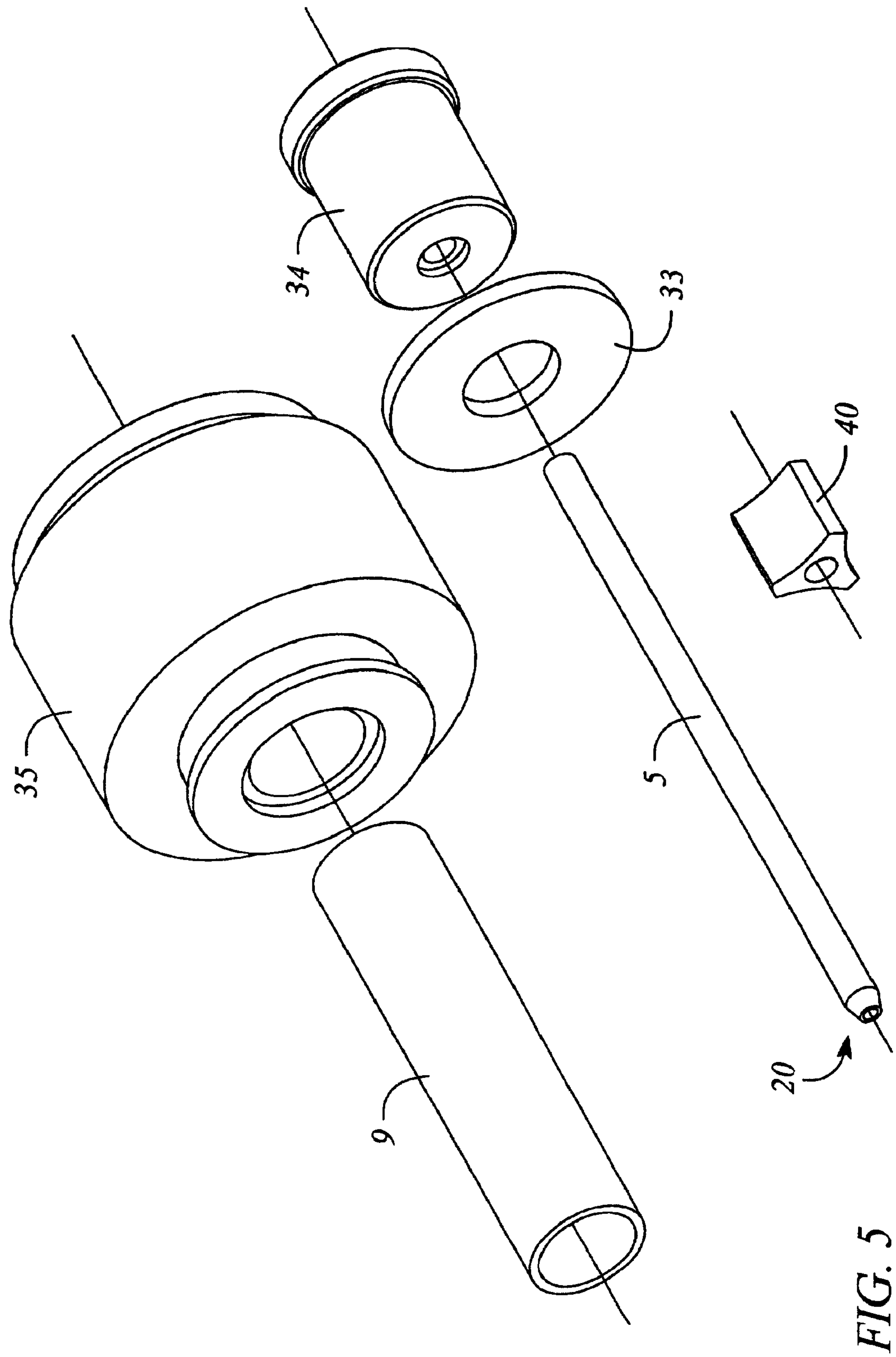
FIG. 5 shows an exploded view of the first embodiment of the invention.
Figure 6:
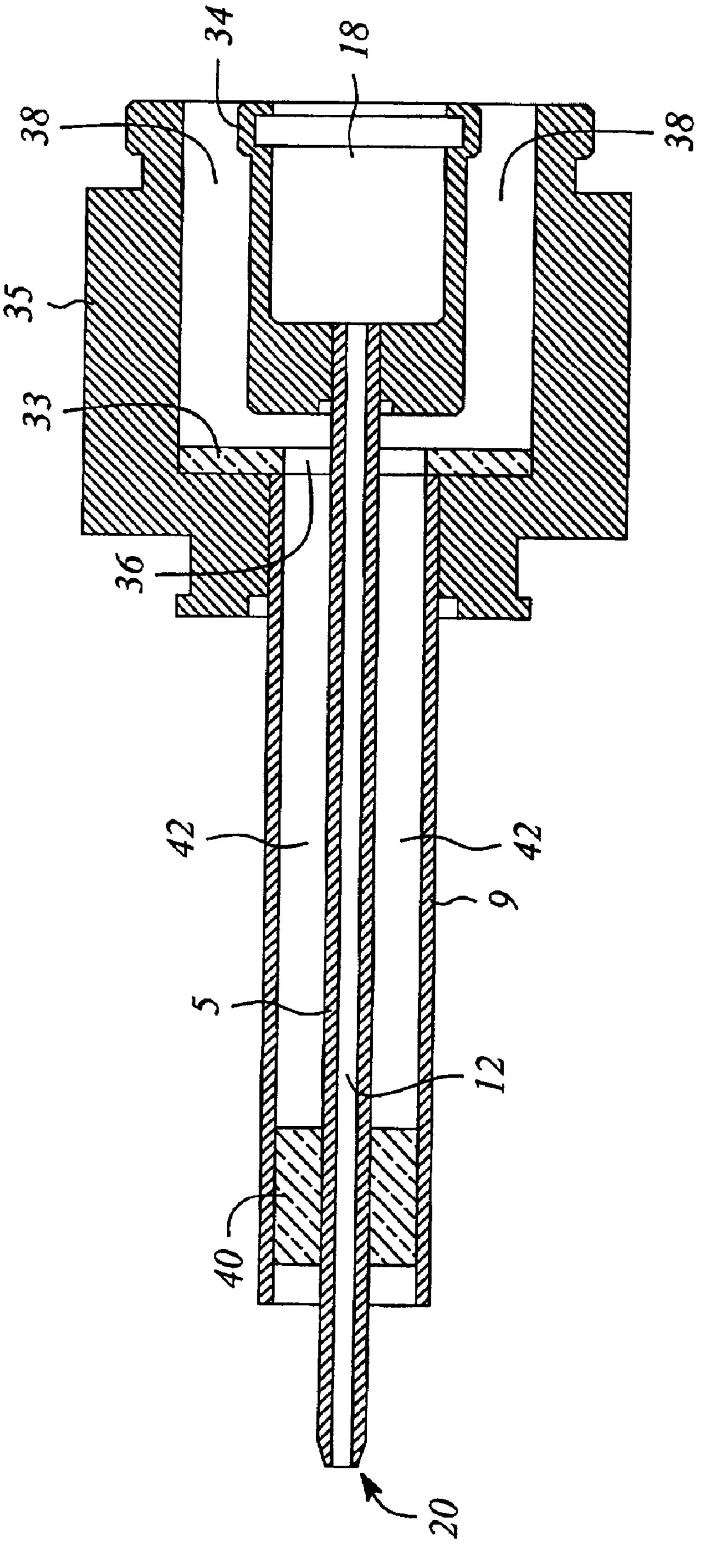
FIG. 6 shows a cross sectional view of the first embodiment of the invention.

FIGS. 2 and 4–6 illustrate the first embodiment of the invention. The conduit 9 is designed to enclose the collecting capillary 5. The conduit 9 may enclose all of the collecting capillary 5 or a portion of it. However, it is important that the conduit 9 be adjacent to the collecting capillary end 20 so that the heated gas can be delivered to the analyte ions located in the ionization region 15 before they enter or are collected by the collecting capillary 5. FIGS. 1–6 and 8, shown only a few embodiments of the present invention and are employed for illustrated purposes only. They should not be interpreted as narrowing the broad scope of the invention. The conduit 9 may be a separate component or may comprise a part of the coupling 23. FIGS. 4–6 show the conduit 9 as a separate component.

FIGS. 4–6 show coupling 23 and its design for joining the collecting capillary 5, the main capillary 18, and the conduit 9. The coupling 23 is designed for attaching to a fixed support 31 (shown in FIGS. 7 and 8). The coupling 23 comprises a spacer 33, a housing 35, and a capillary cap 34 (See FIG. 5). The capillary cap 34 and the spacer 33 are designed to fit within the housing 35. The spacer 33 is designed to apply pressure to the capillary cap 34 so that a tight seal is maintained between the capillary cap 34 and the main capillary 18. The capillary cap 34 is designed to receive the main capillary 18. A small gap 36 is defined between the spacer 33 and the capillary cap 34 (See FIG. 6). The small gap 36 allows gas to flow from the gas source 7 along the collecting capillary 5 as opposed to out of the housing 35.

An optional centering device 40 may be provided between the collecting capillary 5 and the conduit 9. The centering device 40 may comprise a variety of shapes and sizes. It is important that the centering device 40 regulate the flow of gas that is directed into the ionization region 15. FIGS. 4–6 show the centering device as a triangular plastic insert. However, other designs and devices may be employed between the conduit 9 and the collecting capillary 5.

Referring now to FIGS. 1–8, the detector 11 is located downstream from the ion source 3 and the conduit 9. The detector 11 may be a mass analyzer or other similar device well known in the art for detecting the enhanced analyte ions that were collected by the collecting capillary 5 and transported to the main capillary 18. The detector 11 may also comprise any computer hardware and software that are well known in the art and which may help in detecting enhanced analyte ions.

Having described the invention and components in some detail, a description of how the invention operates is in order.

Figure 7:
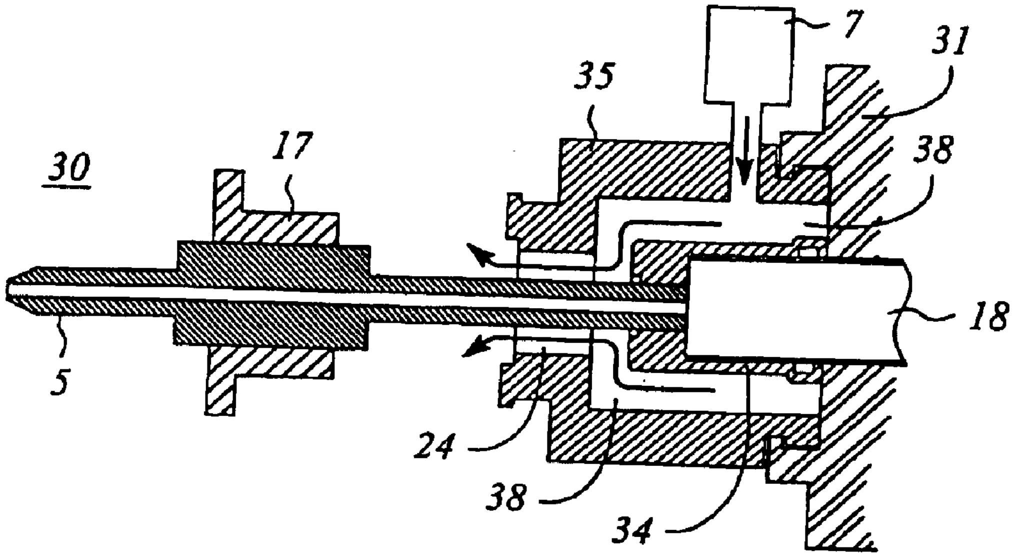
Prior Art FIG. 7
FIG. 7 shows a cross sectional view of an alternative device for comparison that does not supply heated gas to the ionization region.

FIG. 7 shows a cross sectional view of an alternative device for comparison that does not supply heated gas to the ionization region. The collecting capillary 5 is connected to the main capillary 18 by the capillary cap 34. The capillary cap is designed for receiving the main capillary 18 and is disposed in the housing 35. The housing 35 connects directly to the fixed support 31. Note that the gas source 7 provides the gas through the channels 38 defined between the housing 35 and the capillary cap 34. The gas flows from the gas source 7 into the channel 38 through a passageway 24 and then into an ionization chamber 30. The gas is released into the ionization chamber 30, but is not directed into the ionization region 15.

Figure 8:
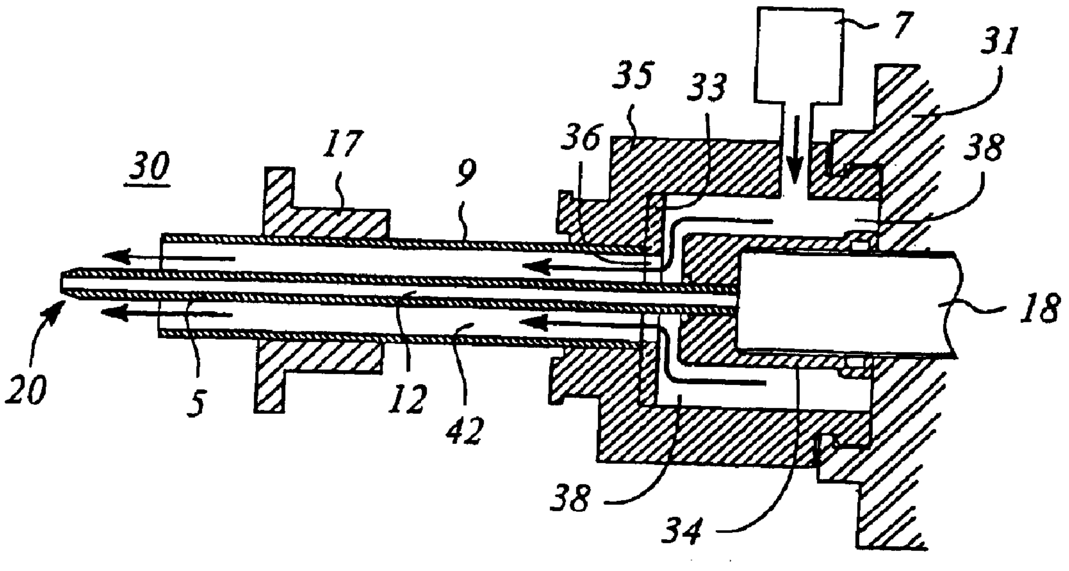
FIG. 8 shows a cross sectional view of the first embodiment of the invention and illustrates how the method of the present invention operates.

FIG. 8 shows a cross sectional view of the first embodiment of the present invention, with the conduit 9 positioned between the ion source 3 and the gas source 7. The conduit 9 operates to carry the heated gas from the gas source 7 to the collecting capillary end 20. The method of the present invention produces enhanced analyte ions for ease of detection in the mass spectrometer 1. The method comprises heating analyte ions located in the ionization region 15 adjacent to the collecting capillary 5 with a directed gas to make them more easily detectable by the detector 11. Gas is produced by the gas source 7, directed through the channels 38 and the small gap 36. From there the gas is carried into an annular space 42 defined between the conduit 9 and the collecting capillary 5. The heated gas then contacts the optional centering device 40 (not shown in FIG. 8). The centering device 40 is disposed between the collecting capillary 5 and the conduit 9 and shaped in a way to regulate the flow of gas to the ionization region 15. Gas flows out of the conduit 9 into the ionization region 15 adjacent to the collecting capillary end 20. The analyte ions in the ionization region 15 are heated by the gas that is directed into this region. Analyte ions that are then enhanced are collected by the collecting capillary 5, carried to the main capillary 18 and then sent to the detector 11. It should be noted that after heat has been added to the analyte ions adjacent to the source, the detection limits and signal quality improve dramatically. This result is quite unexpected. For instance, since no solvent is used with AP-MALDI and MALDI ion sources and mass spectrometers, desolvation and/or application of a gas would not be expected to be effective in enhancing ion detection in matrix based ion sources and mass spectrometers. However, it is believed that the invention operates by the fact that large ion clusters are broken down to produce bare analyte ions that are more easily detectable. In addition, the application of heat also helps with sample evaporation.

It is to be understood that while the invention has been described in conjunction with the specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications infra and supra mentioned herein are hereby incorporated by reference in their entireties.

EXAMPLE 1

Figure 9:
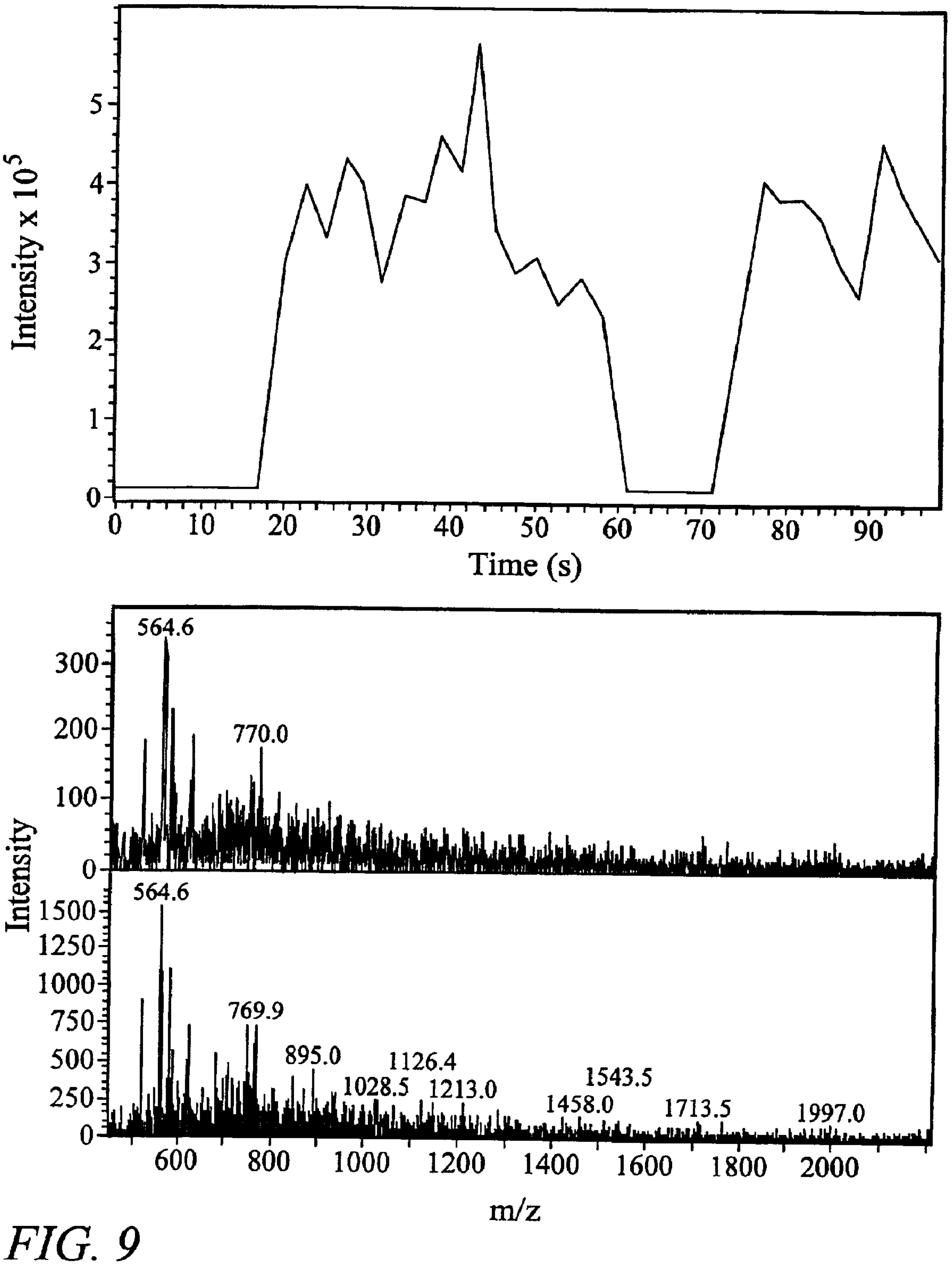
FIG. 9 shows the analysis results of a femto molar peptide mixture without heat supplied by the present invention.

A Bruker Esquire-LC ion trap mass spectrometer was used for AP-MALDI studies. The mass spectrometer ion optics were modified (one skimmer, dual octapole guide with partitioning) and the ion sampling inlet of the instrument consisted of an ion sampling capillary extension with a conduit concentric to a capillary extension. The ion sampling inlet received a gas flow of 4–10 L/min. of heated nitrogen. A laser beam (337.1 nm, at 10 Hz) was delivered by a 400 micron fiber through a single focusing lens onto the target. The laser power was estimated to be around 50 to 70 uJ. The data was obtained by using Ion Charge Control by setting the maximum trapping time to 300 ms (3 laser shots) for the mass spectrometer scan spectrum. Each spectrum was an average of 8 micro scans for 400 to 2200 AMU The matrix used was an 8 mM alpha-cyano-4-hydroxy-cinnamic acid in 25% methanol, 12% TPA, 67% water with 1% acetic acid. Matrix targets were premixed and 0.5 ul of the matrix/target mixture was applied onto a gold plated stainless steel target. Targets used included trypsin digest of bovine serum albumin and standard peptide mixture containing angiotensin I and II, bradykinin, and fibrinopeptide A. Temperature of the gas phase in the vicinity of the target (ionization region) was 25 degrees Celsius. FIG. 9 shows the results without the addition of heated gas to the target or ionization region, as illustrated in FIG. 7. FIG. 9 does not show the existence of sharp peaks (ion enhancement) at the higher m/z ratios.

EXAMPLE 2

Figure 10:
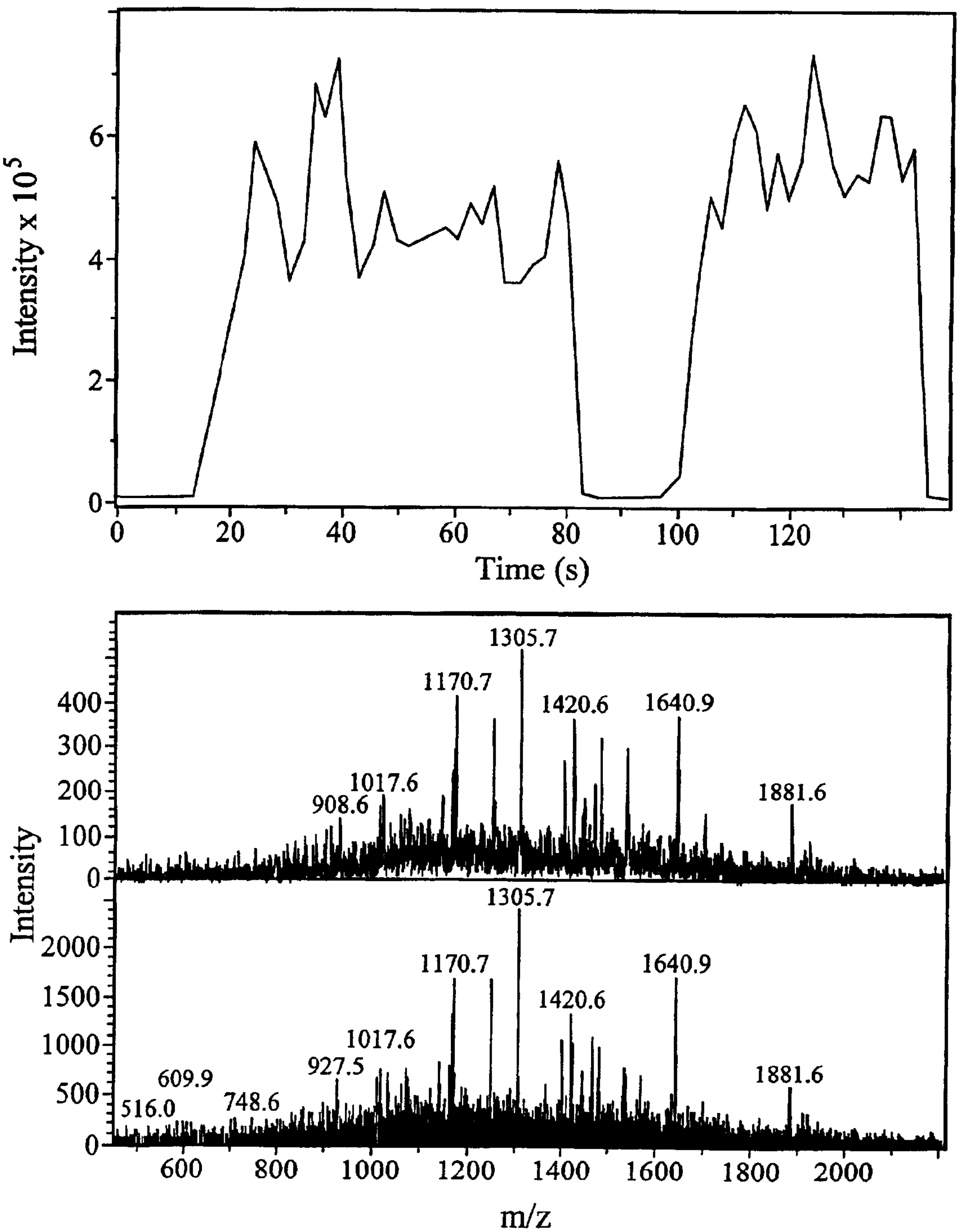
FIG. 10 shows analysis results of a femto molar peptide mixture with the addition of heat supplied by the present invention to the analyte ions produced by the ion source in the ionization region adjacent to the collecting capillary.

The same targets were prepared and used as described above except that heated gas was applied to the target (ionization region) at around 100 degrees Celsius, as shown in FIG. 8. FIG. 10 shows the results with the addition of the heated gas to the target in the ionization region. The figure shows the existence of the sharp peaks (ion enhancement) at the higher m/z ratios.

We claim:

1. A matrix based ion source having a target support for providing heat to enhance analyte ions in an ionization region adjacent to a collecting capillary.

2. A matrix based ion source as recited in claim 1, wherein said ion source is a matrix-assisted laser desorption ionization (MALDI) ion source.

3. An ion source as recited in claim 1, wherein said ion source is a fast atom bombardment (FAB) ion source.

4. An ion source as recited in claim 1, wherein said ion source is an atmospheric pressure matrix assisted laser desorption ionization (AP-MALDI) ion source.

5. An ion source as recited in claim 1, wherein said ion source is at about atmospheric pressure.

6. An ion source as recited in claim 1, wherein said ion source is above atmospheric pressure.

7. An ion source as recited in claim 1, wherein said ion source is below atmospheric pressure.

8. A mass spectrometer, comprising:

(a) a matrix based ion source having a target support designed for heating a target deposited on said target support and producing enhanced analyte ions;

(b) a collecting capillary downstream from said matrix based ion source for receiving said enhanced analyte ions produced from said ion source; and (c) a detector downstream from said collecting capillary for detecting said analyte ions enhanced and received by said collecting capillary.

9. A mass spectrometer as recited in claim 8, wherein said ion source is a matrix assisted laser desorption ionization (MALDI) source.

10. A mass spectrometer as recited in claim 8, wherein said ion source is a fast atom bombardment (FAB) ion source.

11. A mass spectrometer as recited in claim 8, wherein said ion source is an atmospheric pressure matrix assisted laser desorption ionization (AP-MALDI).

12. A mass spectrometer as recited in claim 8, wherein said ion source is at about atmospheric pressure.

13. A mass spectrometer as recited in claim 8, wherein said ion source is below atmospheric pressure.

14. A mass spectrometer as recited in claim 8, wherein said ion source is above atmospheric pressure.

15. A mass spectrometer, comprising:

(a) a matrix based ion source having a heated target support for producing and discharging analyte ions to a region;

(b) a collecting capillary downstream from both said matrix based ion source and said region for receiving said analyte ions produced and discharged from said ion source to said region;

(c) a gas source for providing a gas;

(d) a conduit for conducting gas from said gas source toward said region and providing ion enhancement to said analyte ions located in said region before said analyte ions enter said collecting capillary; and (e) a detector downstream from said collecting capillary for detecting said analyte ions enhanced and received by said collecting capillary.

16. A mass spectrometer as recited in claim 15, wherein said ion source is a matrix assisted laser desorption ionization (MALDI) source.

17. A mass spectrometer as recited in claim 15, wherein said ion source is a fast atom bombardment (FAB) ion source.

18. A mass spectrometer as recited in claim 15, wherein said ion source is an atmospheric pressure matrix assisted laser desorption ionization (AP-MALDI).

19. A mass spectrometer as recited in claim 15, wherein said ion source is at about atmospheric pressure.

20. A mass spectrometer as recited in claim 15, wherein said ion source is below atmospheric pressure.

21. A mass spectrometer as recited in claim 15, wherein said ion source is above atmospheric pressure.

22. A mass spectrometer as recited in claim 16 or 17, wherein said ion source is below atmospheric pressure.

23. A mass spectrometer as recited in claim 16 or 17, wherein said ion source is above atmospheric pressure.

24. The mass spectrometer of claim 15, wherein said conduit is selected from the group consisting of a sleeves, transport device, dispenser, nozzle, hose, pipe, port, connector, tube, coupling, container and a housing.

25. The mass spectrometer of claim 15, wherein said gas provided by said gas source is heated.

26. The mass spectrometer of claim 15, wherein said conduit encloses at least a portion of said collecting capillary.

27. The mass spectrometer of claim 26, wherein said conduit enclosing said portion of said collecting capillary defines an annular space for conducting gas flow between said collecting capillary and said conduit.

28. The mass spectrometer of claim 15, wherein said conduit is adjacent to said collecting capillary.

29. The mass spectrometer of claim 15, wherein said gas carried from said gas source to said region is from 60–150 degrees Celsius.

30. The mass spectrometer of claim 16, wherein said gas is selected from the group consisting of nitrogen, fluorine, air, carbon dioxide, argon, xenon and helium.

31. The mass spectrometer of claim 16, wherein the volume of said region is from 1–5 $mm^3$.

32. The mass spectrometer of claim 16, wherein said gas comprises a monatomic molecule.

33. The mass spectrometer of claim 16, wherein said gas comprises a diatomic molecule.

34. The mass spectrometer of claim 16, wherein said gas comprises a triatomic molecule.

35. The mass spectrometer of claim 16, wherein said gas comprises a polyatomic molecule.

36. The mass spectrometer of claim 16, further comprising a main capillary and a coupling, said coupling for joining together said collecting capillary, said conduit, and said main capillary.

37. The mass spectrometer of claim 36, wherein said coupling further comprises a housing, a capillary cap and a spacer.

38. The mass spectrometer of claim 37, wherein said capillary cap and spacer are disposed in said housing.

39. An apparatus, comprising:

(a) a matrix based ion source having a heated target support for producing enhanced analyte ions;

(b) an ion detector downstream from said ion source for detecting enhanced analyte ions;

(c) an ion enhancement system interposed between said matrix based ion source and said ion detector for also enhancing said analyte ions; and (d) an ion transport system adjacent to said ion enhancement system for transporting said enhanced analyte ions from said ion enhancement system to said detector.

40. An apparatus as recited in claim 39, wherein said ion detector comprises a mass analyzer.

41. An apparatus as recited in claim 39, wherein said ion enhancement system comprises a portion of said ion transport system.

42. An apparatus as recited in claim 39, wherein said ion enhancement system encloses a portion of said ion transport system.

43. An apparatus as recited in claim 39, wherein said ion enhancement system comprises a portion of said ion source.

44. An apparatus as recited in claim 39, wherein said ion enhancement system comprises at least one conduit.

45. An apparatus as recited in claim 39, wherein said ion enhancement system comprises at least one gas source.

46. An apparatus as recited in claim 39, wherein said ion transport system comprises at least one collecting capillary.

47. A mass spectrometer, comprising:

(a) a matrix based ion source having a heated target support for producing analyte ions;

(b) an ion detector downstream from said ion source for detecting enhanced analyte ions;

(c) an ion enhancement system spaced from and interposed between said matrix based ion source and said ion detector for enhancing said analyte ions; and (d) an ion transport system adjacent to said ion enhancement system for transporting said enhanced analyte ions from said ion enhancement system to said detector detection.

48. A mass spectrometer as recited in claim 47, wherein said ion detector comprises a mass analyzer.

49. A mass spectrometer as recited in claim 47, wherein said ion enhancement system comprises a conduit.

50. A mass spectrometer as recited in claim 47, wherein said ion enhancement system comprises a gas source.

51. A mass spectrometer as recited in claim 47, wherein said ion transport system comprises a collecting capillary.

52. A method for producing ions for detection in a mass spectrometer, comprising:

(a) heating analyte ions produced from a matrix based ion source with a heated target support and a directed gas to produce enhanced analyte ions; and (b) detecting said enhanced analyte ions.

53. The method of claim 52, further comprising collecting said enhanced analyte ions in a collecting capillary before said enhanced analyte ions are detected.

54. A method for producing enhanced analyte ions for detection in a mass spectrometer, comprising heating a target support and the ions present in an ionization region adjacent to a collecting capillary to enhance analyte ions located in the ionization region.

55. An apparatus, comprising:

(a) an ion production and enhancement system designed for producing and enhancing analyte ions, comprising a heated target support;

(b) an ion transport system adjacent to said ion production and enhancement system for transporting said enhanced analyte ions from said ion production and enhancement system; and (c) an ion detector downstream from said ion transport system for detecting analyte ions produced and enhanced by said ion production and enhancement system and transported by said ion transport system.

56. An apparatus as recited in claim 55, wherein said ion production and enhancement system comprises an ion source having a target support designed for beating a target deposited on said support and an ionization region adjacent to said support.

57. An apparatus as recited in claim 55, wherein said ion detector is a mass analyzer.

58. An apparatus as recited in claim 55, wherein said ion production and enhancement system comprises a portion of said ion transport system.

59. An apparatus as recited in claim 55, wherein said ion enhancement system comprises a portion of said ion source.

60. A mass spectrometer, comprising:

(a) a matrix based ion source having a heated target support;

(b) an ion detector downstream from said ion source for detecting analyte ions;

(c) an ion enhancement system spaced from and interposed between said matrix based ion source and said ion detector for enhancing said analyte ions; and

6(d) an ion transport system adjacent to said ion enhancement system for transporting said analyte ions from said ion enhancement system to said detector.

61. A mass spectrometer as recited in claim 60, wherein said ion detector comprises a mass analyzer.

62. A method for producing ions with a matrix based ion source, comprising:

(a) producing analyte ions in an ionization region within said matrix based ion source;

(b) enhancing said analyte ions using a heated target support; and (c) detecting said analyte ions with a detector.

63. A method as recited in claim 62, wherein said analyte ions are further enhanced by applying a heated gas to contact said analyte ions.

64. A method for producing and enhancing analyte ions in a mass spectrometer, comprising:

(a) producing and enhancing said analyte ions with an ion production and enhancement system having a heated target support; and (b) detecting said analyte ions with a detector.

* * * * *